(12) United States Patent
Khan et al.

(10) Patent No.: US 7,786,591 B2
(45) Date of Patent: Aug. 31, 2010

(54) DIE DOWN BALL GRID ARRAY PACKAGE

(75) Inventors: Reza-ur Rahman Khan, Rancho Santa Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/952,172

(22) Filed: Sep. 29, 2004

(65) Prior Publication Data

US 2006/0065972 A1   Mar. 30, 2006

(51) Int. Cl.
*H01L 23/34* (2006.01)

(52) U.S. Cl. .............................. 257/777; 257/E23.052; 257/E23.124; 257/E21.705; 257/E23.013; 257/E25.013; 257/E23.004; 257/E23.063; 257/E23.069; 257/E23.079; 257/E23.092; 257/686; 257/723; 257/773; 257/712; 257/668; 257/679; 257/704; 257/701; 257/685

(58) Field of Classification Search .................. 257/700, 257/704, 706, 710, 711, 712, 713, 717, 718, 257/737, 738, 678, 668, 777, 676, E21.705, 257/E23.052, E23.124, E23.013, 723, 773, 257/E25.013, 774, 685, 701, E23.004, E23.069, 257/E23.079, E23.092, 679; 361/704

See application file for complete search history.

(56) References Cited

U.S. PATENT DOCUMENTS

| | | |
|---|---|---|
| 3,790,866 A | 2/1974 | Meyer et al. |
| 4,611,238 A | 9/1986 | Lewis et al. |
| 5,045,921 A | 9/1991 | Lin et al. |
| 5,065,281 A | 11/1991 | Hernandez et al. |
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |

(Continued)

FOREIGN PATENT DOCUMENTS

EP    0 573 297 A2   12/1993

(Continued)

OTHER PUBLICATIONS

Ahn, S.H. and Kwon, Y.S., "Popcorn Phenomena in a Ball Grid Array Package", *IEEE Transactions on Components, Packaging, and Manufacturing Technology Part B: Advanced Packaging*, IEEE, Aug. 1995, vol. 18, No. 3, pp. 491-495.

(Continued)

*Primary Examiner*—Alexander O Williams
(74) *Attorney, Agent, or Firm*—Sterne, Kessler, Goldstein & Fox, PLLC.

(57) ABSTRACT

A cavity or die down ball grid array package includes an interposer substrate structure attached to the die. In an example, the interposer substrate reduces the interconnect length from a board to which the package mounts to power and ground pads on a top layer of the semiconductor or integrated circuit (IC) die. In this example, the interposer substrate also removes the requirement that power and ground pads be located on a periphery of the die. Power and ground pads can be located in an interior region on a top metal layer where they can be interconnected to the interposer substrate using electrically conductive bumps or wire bond(s).

20 Claims, 18 Drawing Sheets

U.S. PATENT DOCUMENTS

| | | |
|---|---|---|
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A | 6/1997 | Bond et al. |
| 5,648,679 A | 7/1997 | Chillara et al. |
| 5,650,659 A | 7/1997 | Mostafazadeh et al. |
| 5,650,662 A | 7/1997 | Edwards et al. |
| 5,691,567 A | 11/1997 | Lo et al. |
| 5,717,252 A | 2/1998 | Nakashima et al. |
| 5,736,785 A | 4/1998 | Chiang et al. |
| 5,744,863 A | 4/1998 | Culnane et al. |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A | 3/1999 | Culnane et al. |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A | 5/1999 | Chen et al. |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A | 11/1999 | Suzuki et al. |
| 5,982,621 A | 11/1999 | Li |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,008,536 A | 12/1999 | Mertol |
| 6,011,304 A | 1/2000 | Mertol |
| 6,011,694 A | 1/2000 | Hirakawa |
| 6,020,637 A | 2/2000 | Karnezos |
| 6,028,358 A | 2/2000 | Suzuki |
| 6,034,427 A | 3/2000 | Lan et al. |
| 6,040,984 A | 3/2000 | Hirakawa |
| 6,057,601 A | 5/2000 | Lau et al. |
| 6,060,777 A | 5/2000 | Jamieson et al. |
| 6,064,111 A | 5/2000 | Sota et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,242,279 B1 | 6/2001 | Ho et al. |
| 6,246,111 B1 | 6/2001 | Huang et al. |
| 6,278,613 B1 | 8/2001 | Fernandez et al. |
| 6,288,444 B1 | 9/2001 | Abe et al. |
| 6,303,996 B2 * | 10/2001 | Lin .......................... 257/777 |
| 6,313,521 B1 | 11/2001 | Baba |
| 6,313,525 B1 | 11/2001 | Sasano |
| 6,347,037 B2 | 2/2002 | Iijima et al. |
| 6,362,525 B1 | 3/2002 | Rahim |
| 6,365,980 B1 | 4/2002 | Carter, Jr. et al. |
| 6,369,455 B1 | 4/2002 | Ho et al. |
| 6,373,131 B1 * | 4/2002 | Karnezos .................. 257/712 |
| 6,380,623 B1 | 4/2002 | Demore |
| 6,385,049 B1 | 5/2002 | Chia-Yu et al. |
| 6,395,582 B1 | 5/2002 | Sohn et al. |
| 6,433,440 B1 * | 8/2002 | Ogino et al. ................ 257/784 |
| 6,462,274 B1 | 10/2002 | Shim et al. |
| 6,472,741 B1 | 10/2002 | Chen et al. |
| 6,483,187 B1 * | 11/2002 | Chao et al. .................. 257/712 |
| 6,515,870 B1 | 2/2003 | Skinner et al. |
| 6,525,942 B2 | 2/2003 | Huang et al. |
| 6,528,869 B1 | 3/2003 | Glenn et al. |
| 6,528,892 B2 | 3/2003 | Caletka et al. |
| 6,541,832 B2 | 4/2003 | Coyle |
| 6,545,351 B1 | 4/2003 | Jamieson et al. |
| 6,552,266 B2 | 4/2003 | Carden et al. |
| 6,552,428 B1 | 4/2003 | Huang et al. |
| 6,552,430 B1 | 4/2003 | Perez et al. |
| 6,563,712 B2 | 5/2003 | Akram et al. |
| 6,583,516 B2 | 6/2003 | Hashimoto |
| 6,602,732 B2 | 8/2003 | Chen |
| 6,614,660 B1 | 9/2003 | Bai et al. |
| 6,617,193 B1 | 9/2003 | Toshio et al. |
| 6,653,730 B2 | 11/2003 | Chrysler et al. |
| 6,657,870 B1 | 12/2003 | Ali et al. |
| 6,664,617 B2 | 12/2003 | Siu |
| 6,724,071 B2 | 4/2004 | Combs |
| 6,724,080 B1 | 4/2004 | Ooi et al. |
| 6,819,566 B1 | 11/2004 | Danovitch et al. |
| 6,906,414 B2 | 6/2005 | Zhao et al. |
| 7,193,320 B2 * | 3/2007 | Hosoyamada et al. ........ 257/738 |
| 7,271,479 B2 * | 9/2007 | Zhao et al. .................. 257/704 |
| 7,402,906 B2 * | 7/2008 | Khan et al. .................. 257/712 |
| 7,411,281 B2 * | 8/2008 | Zhang ........................ 257/678 |
| 7,432,586 B2 | 10/2008 | Zhao et al. |
| 7,482,686 B2 | 1/2009 | Zhao et al. |
| 2001/0001505 A1 | 5/2001 | Schueller et al. |
| 2001/0040279 A1 | 11/2001 | Mess et al. |
| 2001/0045644 A1 | 11/2001 | Huang |
| 2002/0012099 A1 | 1/2002 | Miwa et al. |
| 2002/0053731 A1 | 5/2002 | Chao et al. |
| 2002/0072214 A1 | 6/2002 | Yuzawa et al. |
| 2002/0079562 A1 | 6/2002 | Zhao et al. |
| 2002/0079572 A1 | 6/2002 | Khan et al. |
| 2002/0096767 A1 | 7/2002 | Cote et al. |
| 2002/0098617 A1 | 7/2002 | Lee et al. |
| 2002/0109226 A1 * | 8/2002 | Khan et al. .................. 257/737 |
| 2002/0113306 A1 | 8/2002 | Kwon et al. |
| 2002/0135065 A1 | 9/2002 | Zhao et al. |
| 2002/0171144 A1 | 11/2002 | Zhang et al. |
| 2002/0180040 A1 | 12/2002 | Camenforte et al. |
| 2002/0185717 A1 | 12/2002 | Eghan et al. |

| | | | |
|---|---|---|---|
| 2002/0185720 | A1 | 12/2002 | Khan et al. |
| 2002/0185722 | A1 | 12/2002 | Zhao et al. |
| 2002/0185734 | A1 | 12/2002 | Zhao et al. |
| 2002/0185750 | A1 | 12/2002 | Khan et al. |
| 2002/0190361 | A1 | 12/2002 | Zhao et al. |
| 2002/0190362 | A1 | 12/2002 | Khan et al. |
| 2003/0015783 | A1* | 1/2003 | Schaper ............. 257/691 |
| 2003/0025180 | A1 | 2/2003 | Alcoe et al. |
| 2003/0057550 | A1 | 3/2003 | Zhao et al. |
| 2003/0111726 | A1 | 6/2003 | Khan et al. |
| 2003/0137057 | A1 | 7/2003 | Honda |
| 2003/0138613 | A1 | 7/2003 | Thoman et al. |
| 2003/0146503 | A1 | 8/2003 | Khan et al. |
| 2003/0146506 | A1 | 8/2003 | Khan et al. |
| 2003/0146509 | A1 | 8/2003 | Zhao et al. |
| 2003/0146511 | A1 | 8/2003 | Zhao et al. |
| 2003/0148554 | A1* | 8/2003 | Gerber et al. ............. 438/122 |
| 2003/0179549 | A1 | 9/2003 | Zhong et al. |
| 2003/0179556 | A1 | 9/2003 | Zhao et al. |
| 2003/0222344 | A1* | 12/2003 | Hosoyamada et al. ....... 257/738 |
| 2004/0072456 | A1 | 4/2004 | Dozier, II et al. |
| 2004/0113284 | A1 | 6/2004 | Zhao et al. |
| 2004/0212051 | A1 | 10/2004 | Zhao et al. |
| 2005/0104196 | A1* | 5/2005 | Kashiwazaki ............. 257/706 |
| 2005/0224955 | A1* | 10/2005 | Desai et al. ............. 257/706 |
| 2005/0280141 | A1* | 12/2005 | Zhang ................ 257/707 |
| 2007/0023488 | A1* | 2/2007 | Lawlyes et al. ........ 228/180.22 |
| 2007/0069352 | A1* | 3/2007 | Ho et al. ............. 257/678 |
| 2007/0114642 | A1* | 5/2007 | Hosoyamada et al. ....... 257/676 |
| 2007/0216009 | A1* | 9/2007 | Ng ................. 257/690 |
| 2008/0006934 | A1* | 1/2008 | Zhao et al. ............. 257/713 |
| 2008/0096325 | A1* | 4/2008 | Kao et al. ............. 438/122 |
| 2008/0182364 | A1 | 7/2008 | Zhang |
| 2009/0115048 | A1 | 5/2009 | Zhao et al. |

FOREIGN PATENT DOCUMENTS

| | | |
|---|---|---|
| EP | 0 504 411 B1 | 6/1998 |
| EP | 0 883 180 A2 | 12/1998 |
| EP | 0 883 180 A3 | 12/1998 |
| EP | 1 367 642 A2 | 12/2003 |
| EP | 1 367 642 A3 | 12/2003 |
| FR | 2 803 098 A3 | 6/2001 |
| JP | 61-49446 A | 3/1986 |
| JP | 7-283336 A | 10/1995 |
| JP | 10-50877 A | 2/1998 |
| JP | 10-189835 A | 7/1998 |
| JP | 10-247702 A | 9/1998 |
| JP | 10-247703 A | 9/1998 |
| JP | 11-17064 A | 1/1999 |
| JP | 11-102989 A | 4/1999 |
| JP | 2000-286294 A | 10/2000 |
| JP | 2001-68512 A | 3/2001 |
| TW | 383908 | 3/2000 |
| TW | 417219 | 1/2001 |
| WO | WO 98/50952 A1 | 11/1998 |

OTHER PUBLICATIONS

Amkor Electronics, "Amkor BGA Packaging: Taking The World by Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Ball Grid Array Technology," *Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs. QFP: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code- A Case Study of Plastic Packages", *IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translation of JP 10-247702, published Sep. 14, 1998, 8 pages.

English-language Abstract of JP 10-247703, published Sep. 14, 1998, 1 page, printed from http://v3.espacenet.com.

English-language Abstract of JP 10-050877, published Feb. 20, 1998, 1 page, printed from http://v3.espacenet.com.

English-language Translation of JP 11-102989, published Apr. 14. 1999, 24 pages.

English-language Abstract of JP 11-017064, published Jan. 22, 1999. 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1986, 1 page, printed from http://v3.espacenet.com.

English-language Abstract of JP 7-283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Count PBGA Assembly: Solder Defect Failure Modes and Root Cause Analysis", *Surface Mount International, Proceedings of the Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production, Cahners Publishing Company*, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. And Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging, and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Testing: New Package Offers Promise but Must Clear Technology Hurdles.", *Advanced Packaging*. IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE,1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques of Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes On QFPs", *Advanced Packaging*, IHS Publishing Group, Winter 1993, vol. 2, No. 1, pp. 38-39.

Houghten, J.L., "Plastic Ball-Grid Arrays Continue to Evolve", *Electronic Design*, Feb. 6, 1995, pp. 141-146.

"How to Give Your BGAs a Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Johnson, R. et al., "A Feasibility Study of of Ball Grid Array Packaging", *National Electronic Packaging and Production Conference East '93*, Boston, Massachusetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array National Symposium*, Dallas, Texas, Mar. 29-30, 1995, pp. 2-21.

Kamezos, M. , "An EPBGA Alternative," *Advanced Packaging*, Jun. 1998, pp. 90, 92, 94, and 96.

Kawahara, T. et al., "Ball Grid Array Type Package by Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI Logic Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthroughs Achieved with the New *Super*BGA® Package", *1995 International Electronics Packaging Conference*, San Diego, California, Sep. 24-27, 1995, pp. 565-576.

Marrs, R.C. and Olachea, G., "BGAs for MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaertl, L., "How IC Packages Affect PCB Design", *Surface Mount Technology Magazine*, Feb. 1995, vol. 9, No. 2, pp. 114-116.

Mearig, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26-28.

"Pad Array Improves Density", *Electronic Packaging & Production*, Cahners Publishing Company, May 1992, pp. 25-26.

Partridge, J. and Viswanadham, P., "Organic Carrier Requirements for Flip Chip Assemblies", *Journal of Surface Mount Technology*, Surface Mount Technology Association, Jul. 1994, pp. 15-20.

Ramirez, C. and Fauser, S., "Fatigue Life Comparison of The Perimeter and Full Plastic Ball Grid Array", *Surface Mount International Conference Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27 - Mar. 4, 1994, Anaheim, California, pp. 1277-1282.

Rooks, S., "X-Ray Inspection of Flip Chip Attach Using Digital Tomosynthesis", *Surface Mount International Proceedings of the Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

Sakaguchi, H., "BGA Mounting Technology," pp. 1-4, date and source unknown.

Schmolze, C. and Fraser, A., "SPICE Modeling Helps Enhance BGA Performance", *Electronic Packaging & Production*, Jan. 1995, pp. 50-52.

Schueller, R.D. et al., "Performance and Reliability of a Cavity Down Tape BGA Package," *IEEE Electronic Packaging Technology Conference*, 1997, pp. 151-162.

*Semiconductor Group Package Outlines Reference Guide*, Texas Instruments, 1995, entire document submitted.

Shimizu, J., "Plastic Ball Grid Array Coplanrity", *Surface Mount International Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

Solberg, V., "Interconnect Structure Preparation: Impact of Material Handling and PCB Surface Finish on SMT Assembly Process Yield", *Ball Grid Array National Symposium*, Dallas Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207-213.

Tuck, J., "BGA Technology Branches Out", *Circuits Assembly*, Feb. 1995, vol. 6, No. 2, pp. 24, 26, and 28.

"Tutorials and Short Courses", *45th Electronic Components & Technology Conference*, May 21-24, 1995, Las Vegas, Nevada, IEEE, 4 pages.

Vardaman, E. J. and Crowley, R.T., "Worldwide Trends in Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West '95*, Reed Exhibition Companies, Feb. 26-Mar. 2, 1995, Anaheim, California, pp. 1530-1541.

Zamborsky, E., "BGAs in the Assembly Process", *Circuits Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Product", *Electronic Packaging & Production (Special Supplement)*, Cahners Publishing Company, Aug. 1994 (Supplement), p. 41.

Freyman, B. and Petrucci, M., "High-Pincount PBGAs: Implementation Into Volume Manufacturing," *Advanced Packaging*, An IHS Group Publication, May/Jun. 1995, pp. 44-46.

English-language Abstract of FR 2803098, published Jun. 29, 2001, 1 page, printed from http://v3.espacenet.com.

English-language Summary of Decision of Rejection from Taiwanese Application No. 91108573, 5 pages.

Amkor package data sheet, "SuperFC® ", from http://www.amkor.com/Products/all_datasheets/superfc.pdf, 2 pages (Jan. 2003).

Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).

Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).

Harper, C.A. (ed.), *Electronic Packaging and Interconnection Handbook*, Third Edition, pp. 7.58-7.59, ISBN No. 0-07-134745-3, McGraw-Hill Companies (2000).

Lin, S. and Chang, N., "Challenges in Power-Ground Integrity," *Proceedings of the 2001 International Conference on Computer-Aided Design*, pp. 651-654 (Nov. 4-8, 2001).

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE Transactions on Very Large Scale Integration (VLSI) Systems*, vol. 10, No. 4, pp. 487-493 (Aug. 2002).

Siliconware Precision Industries, "Flip Chip Package", 5 pages, copyright Siliconware Industries Co., Ltd., May 2000.

Search Report for European Application No. 05007679.3-2203 / 1643551 mailed Jun. 3, 2009, 3 pgs.

\* cited by examiner

DIE DOWN BALL GRID ARRAY PACKAGE

BACKGROUND OF THE INVENTION

1. Field of the Invention

The present invention is related to cavity down array integrated circuit (IC) packages.

2. Background Art

Integrated circuit (IC) devices utilize packaging technology, such as die-down array packages. The IC packages provide environmental protection for the IC, allow the IC to be mounted on a board, and allow signals to be interfaced with the IC, among other functions.

What is needed is an efficient power delivery structure on an IC package that reduces trace length on a top metal of an IC die, reduces wire bond length to power pads on the IC die, and reduces trace length from printed wire board (PWB) power/ground planes to the package.

BRIEF SUMMARY OF THE INVENTION

An embodiment of the present invention provides a second substrate that is used to coupled an IC die to a printed circuit board (PCB)/PWB, which is in addition to a conventional first substrate of an IC package. In an example, the substrate is the second substrate is coupled to the die and PCB/PWB by corresponding arrays of interconnects, such as solder balls, pins, etc.

Another embodiment of the present invention provides a ball grid array (BGA) package. The ball grid array package comprises a heat spreader, first and second substrates, and an integrated circuit (IC) die. The first substrate has an opening that extends through the substrate, such that a portion of the heat spreader is accessible through the opening. The integrated circuit (IC) die is attached to the heat spreader and through the opening of the substrate. The second substrate has a first surface and is attached to bond pads located in a central portion of the IC die via a interconnection network. A second surface of the second substrate has an array of contact pads capable of coupling to a board when the package is mounted to the board.

In an example, the BGA package further comprises a wire bond arrangement that attaches at least one of the IC die, the first substrate, the second substrate, and the heat spreader to at least one of the IC die, the first substrate, the second substrate, and the heat spreader.

Another embodiment of the present invention provides a method of forming a BGA. An integrated circuit (IC) die is coupled to a heat spreader in an opening of a substrate, the opening of the substrate extending through the substrate, such that a portion of the heat spreader is accessible through the opening. A second substrate is coupled to bond pads located in a central portion of the IC die via a interconnection network.

A still further embodiment of the present invention provides an interposer substrate that facilitates power delivery to semiconductor die for cavity down array (e.g., BGA, PGA, etc.) packages.

In various examples, the interposer substrate is constructed from a planar printed circuit board, tape, or an electrically conductive plate (e.g., copper) and has electrical interconnect with the semiconductor die.

In various examples, the interposer substrate is attached to the active surface of semiconductor with metal bumps or adhesives.

In an example, a mold compound covers the die and partially covers the interposer substrate for environmental protection. The bottom surface of the interposer substrate is exposed entirely or partially for electrical interconnect with a printed circuit board (PCB) or a printed wire board (PWB) on which the package is mounted.

In various examples, one or more metal pads are exposed at the bottom of the interposer substrate.

In various examples, the electrical interconnect between the package interposer substrate and the PCB/PWB can be one or more solder balls, electrically conductive columns, pins, or the like.

In an example, the exposed metal pad or pads on the bottom surface of the interposer substrate may also be directly soldered to PCB/PWB by printing solder paste at the corresponding locations/pads on the PCB/PWB and reflow.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
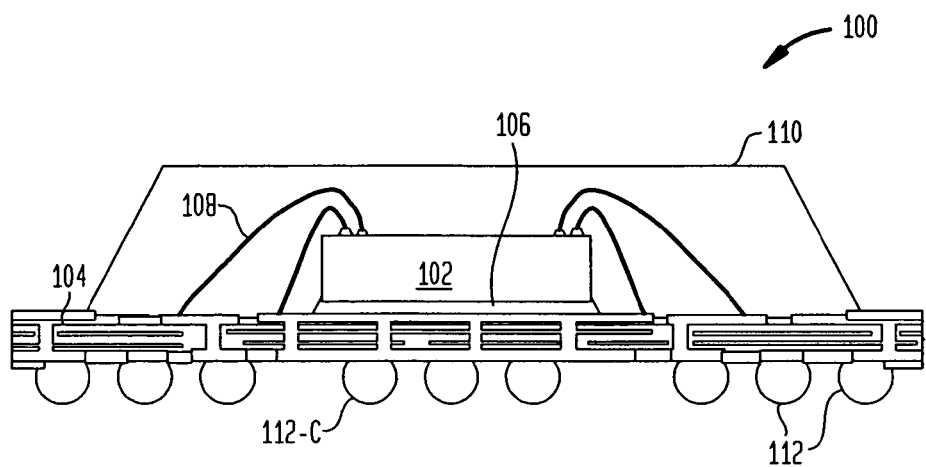
FIG. 1 shows a die-up ball grid array package.

The present invention will now be described with reference to the accompanying drawings. In the drawings, like reference numbers may indicate identical or functionally similar elements. Additionally, the left-most digit(s) of a reference number may identify the drawing in which the reference number first appears.

DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a cavity or die down ball grid array package including an interposer substrate structure attached to the package integrated circuit (IC) die or chip. In an example, the interposer substrate reduces the interconnect length to power and ground pads on a top layer of the die. In this example, the interposer substrate also removes the requirement that power and ground pads be located on a periphery of the die. Power and ground pads can be located in an interior region on a top metal layer of the die where they can be interconnected to the interposer substrate using electrically conductive bumps (e.g., solder, gold, etc.) and/or wire bond(s).

In an example, using this configuration provides more space on the top metal of the die for input/output (I/O) signal routing, which allows for a reduction in die size.

In an example, placing the power supply pads in the interior region on the chip reduces the lengths of power supply current paths within the chip. This can reduce IR voltage drops within the chip.

In an example, the interposer substrate reduces the trace length for power delivery from a printed circuit board (PCB) or printed wire board (PWB) to the bond pad(s) on the die and provides flexibility for trace routing of power and ground nets on the die and the interposer substrate.

In an example, methods of integration of a power delivery interposer substrate for wire bond cavity down area array IC packages reduce IR drop, as is described in more detail below. In this example, the interposer substrate is used for power distribution and delivery to power and ground pads of the top metal layer of the die. Also, in this example the interposer substrate reduces interconnect length for the die, package, and PWB. The interposer substrate can also be used for I/O signal interconnections for the package.

Throughout the description, the use of interconnection device, interconnection network, interconnection array, array of interconnection elements, array of solder balls, etc. are all used interchangeably to mean an interface allowing signal and power flow between the various devices (e.g., electrical components) in a package.

Exemplary Cavity Up Ball Grid Array Package

FIG. 1 shows a die-up ball grid array package 100. Package 100 includes a die 102 attached to a substrate 104 (e.g., a printed circuit substrate) via an adhesive material 106 (e.g., epoxy). A circuit (not shown) on die 102 is attached to substrate 104 via wirebond interconnects 108. Package 100 is encapsulated using, for example, a mold compound 110. Package 100 is attached to a printed wire board (PWB) (not shown), or the like, via an interconnection device 112, which can be, for example, solder balls. Solder balls 112-C are centered under die 102.

A cavity up plastic ball grid array package, such as package 100, was first introduced by Motorola and was called Overmolded Plastic Pad Array Carriers (OMPAC). An example OMPAC is found in B. Freyman, and R. Pennisi, "Overmolded Plastic Pad Array Carriers (OMPAC): A Low Cost, High Interconnect Density IC Packaging Solution for Consumer and Industrial Electronics," Electronic Components and Technology Conference, IEEE, pp. 176-182, 1991, which is incorporated by reference herein in its entirety. Commonly known as PBGA package, the plastic ball grid array package features a plastic printed circuit board (e.g., substrate), such as substrate 104, typically made of BT (Bismaleimide Triazine) resins or fire retardant type 4 (FR4) materials.

With reference to FIG. 1, in die-up packages, a single IC semiconductor die 102 (or multiple IC dice) can be attached directly to a top surface of a printed circuit substrate 104 using epoxy 106. Wirebond 108 is used to electrically connect the circuit of semiconductor die 102 to the printed circuit of substrate 104. A matrix or array of solder balls 112 is mounted on the bottom side of substrate 104. IC die 102 and wirebond interconnect 108 are protected from the environment by plastic molding compound 110, which encapsulates both die 102 and bond wires 108 and covers partially (or entirely) the top surface of substrate 104.

In some circumstances, BGA package 100 can exhibit poor thermal performance. This is because materials for both substrate 104 and plastic molding compound 110 can have low thermal conductivity values (e.g., around k=0.19~0.3 W/m° C. for BT or FR4 type substrate and k=0.2~0.9 W/m° C. for molding compound). Since die 102 is surrounded entirely by materials having a relatively poor heat conduction property, the heat generated by IC die 102 is trapped within PBGA package 100. The temperature of IC die 102 has to rise to very high values above the environment temperature in order to release the trapped heat to the environment.

Exemplary Cavity Down Ball Grid Array Package

Figure 2A:
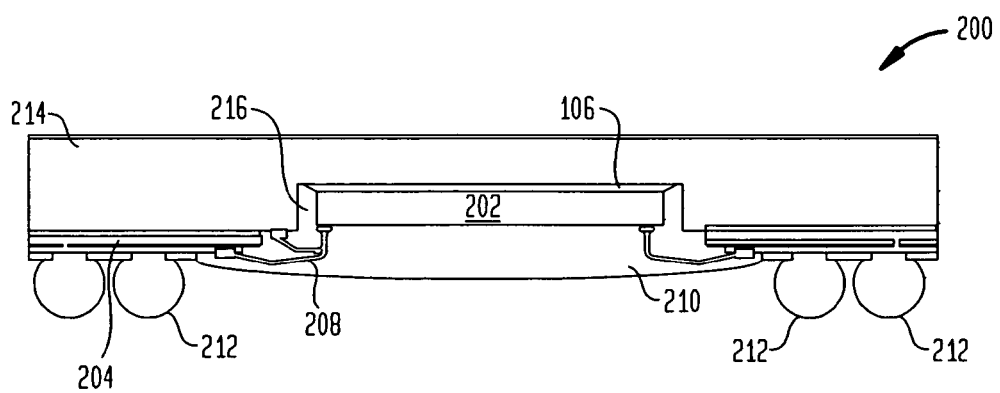
FIG. 2A shows a cavity down tape ball grid array (TBGA) package.
Figure 2B:
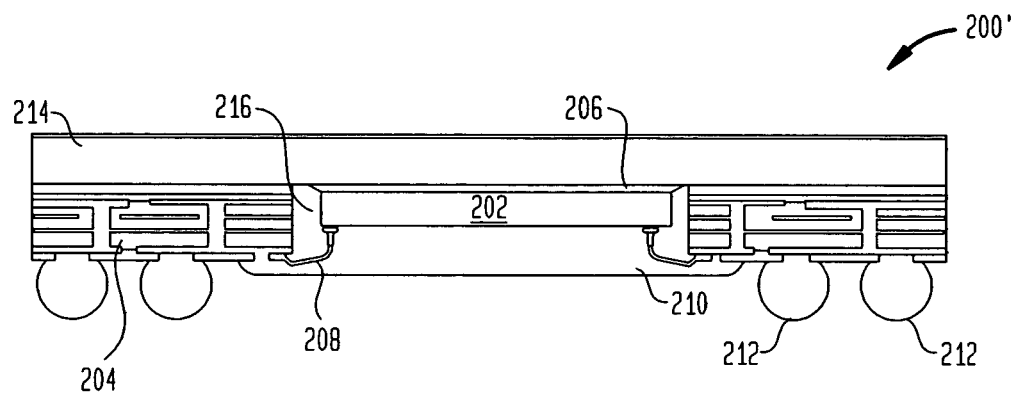
FIG. 2B shows a cavity down ball grid array with organic or ceramic substrate.
Figure 2C:
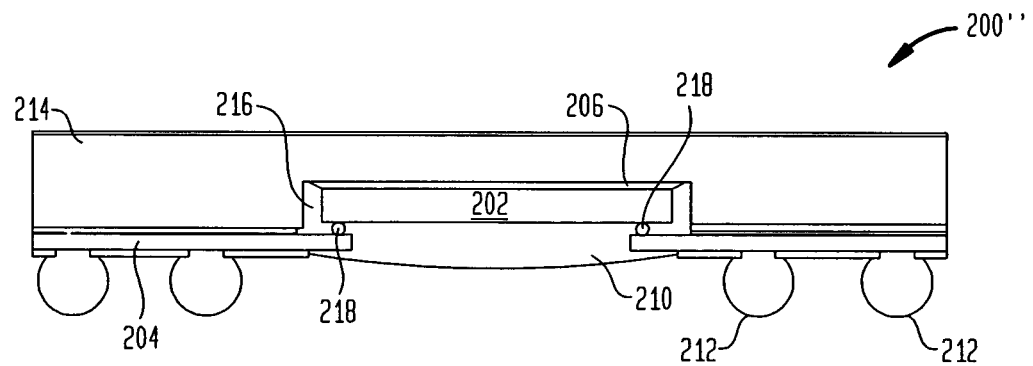
FIG. 2C shows an area tape automated bonding (ATAB) package.

FIG. 2A shows a cavity down tape ball grid array (TBGA) package 200. FIG. 2B shows a cavity down ball grid array package 200' with organic or ceramic substrate. FIG. 2C shows an area tape automated bonding (ATAB) package 200". A main difference between these package types is that wirebond interconnects 208 shown in FIGS. 2A and 2B for packages 200 and 200' are replaced with solder or gold bump interconnects 218 shown in FIG. 2C for package 200". These interconnects 208 and 218 are used to couple signals of a die 202 to a substrate 204 and/or a heat spreader 214 of the respective package.

To improve the thermal performance of die-up area array packages, such as package 100, cavity down ball grid array (BGA) packages 200, 200', and 200" and cavity down pin grid array (PGA) packages (now shown), were developed. An example cavity down package is found in B. Ghosal, R. Sigliano, and Y. Kunimatsu, Chapter 14 in "Area Array Interconnection Handbook" by K. Puttlitz and P. A. Totta, Kluwer, Boston, 2001, which is incorporated by reference herein in its entirety. In the packages 200, 200', and 200" in FIGS. 2A-2C, a back surface of die 202 is attached to a heat spreader 214 (e.g., a heat sink or cold plate) made from a thermally conductive material, such as copper (k~400 W/m° C.) or ceramic (k~50 W/m° C.) for heat spreading and low thermal resistance cooling path.

Because a cavity 216 in heat spreader 214 is used to receive die 202 in packages 200, 200', 200", it may not be possible to place solder balls 212 or pins (not shown) beneath die 202 for wire bond cavity down packages 200, 200', and 200". For the same reason, an increase in package size is usually desired to increase package pin count for high I/O applications. Consequently, a circuit length from package pins to devices (e.g., electrical components) on the chip and the I/O on the chip is longer due to the increase of package substrate size. When the die size is large (e.g., more than 9 mm×9 mm), an on-chip trace length from wire bond pad on the periphery of die 202 to a center region of die 202 can be very long. Circuit resistances and inductances increase with the increased length of the electrical path on both the package substrate and the semiconductor die. Ohm's law states that I=V/R, where I is the current, V the voltage drop, and R the resistance. The increased path length increases circuit resistance of substrate 204 and die 202. This increases the voltage drop and reduces the current-carrying capacity of a power delivery network (e.g., a portion of substrate 204 and die 202 that transmit and receive power from a power source) on both substrate 204 and semiconductor die 202.

In addition, a "voltage noise" generated due to switching, or "switching noise", is proportional to L dI/dt where L is the power delivery loop inductance and dI/dt is the rate of change of current. An increase in inductance will also introduce a higher level of switching noise manifested by a drop in voltage available to die 202. An increase in switching frequency will lead to higher switching noise. The switching noise will cause delay that could affect timing and eventually cause logic error.

The cavity down array packages 200, 200', and 200" can have a die size of about 9 mm×9 mm or larger and are typically large in body size (e.g., about 27 mm×27 mm to about 45 mm×45 mm). They also have relatively high inductance for the core and I/O power network from package pins to the core power and I/O buffer on semiconductor die 202. Due to the inductive nature of the power delivery network and an inability for high frequency on-chip power delivery for these cavity down packages, application of these packages is limited for high-speed digital systems.

Cavity Down Wire Bond Array Packages with Drop-In Heat Spreader

Figure 3:
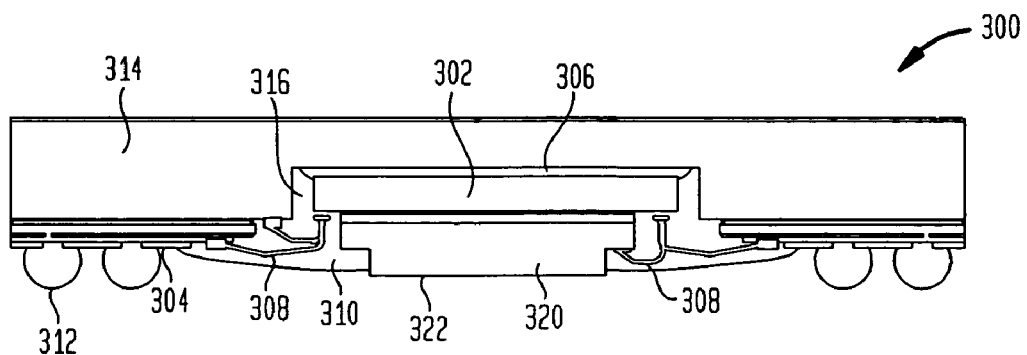
FIG. 3 shows a TBGA with a drop-in heat spreader used for Power/Ground Plane in the TBGA.

FIG. 3 shows a TBGA package 300 with a drop-in heat spreader 320, which can be used for a power or ground plane in TBGA package 300. To improve package thermal performance, drop-in heat spreader 320 is positioned in a die encapsulation mold 310 of package 300. An example of this configuration is found in U.S. Ser. No. 09/783,034, filed Feb. 15, 2001, to R. Khan and S. Zhao, entitled "Enhanced Die-Down Ball Grid Array Packages and Method for Making the Same," which is incorporated by reference herein in its entirety. Drop-in heat spreader 320 promotes spreading of heat within plastic molding compound 310, which covers die receiving cavity 316. Furthermore, drop-in heat spreader 320 can be used as either a power plane or a ground plane of package 300. For example, power or ground pads of package die 302 can be coupled by wire bonds 308 to the periphery of the drop-in heat spreader 320. When a bottom surface 322 of drop-in heat spreader 320 is exposed, its bottom surface can be soldered to a PCB (not shown) during or after surface mount, to connect the PCB power or ground plane to package 300. In an example, power or ground traces and balls on flex tape substrate 304 can be eliminated through the use of heat spreader 320, which can lead to shorter current travel length and reduce package inductance and resistance.

However, direct contact between die 302 and heat spreader 320 may cause damage to and shorting of the active surface of die 302, as well as, wirebond interconnect 308, which couples die 302 to substrate 304. For reference, see U.S. Pat. No. 5,977,626 that issued Nov. 2, 1999, which is incorporated by reference herein in its entirety.

Variations of drop-in heat spreader package designs have been developed for die-up BGA packages to improve on manufacturing process. See, for example, U.S. Pat. No. 6,552,428 B1 that issued Apr. 22, 2003, entitled "Semiconductor Package Having An Exposed Heat Spreader," which is incorporated by reference herein in its entirety.

In these implementations, direct electrical connection between the drop-in heat spreader and the power/ground pads of the semiconductor die are not possible. In addition, the IC die is isolated by a plastic molding compound and an organic substrate. Thus, heat dissipation from the die must penetrate the plastic molding compound to reach the heat spreader. The typical values of thermal conductivity are 0.5~0.9 W/m° C. for a molding compound and are 0.2~2 W/m° C. for circuitized organic substrate. These values are substantially lower than the thermal conductivity value of copper (k~400 W/m° C.) or aluminum (k~180 W/m° C.). Thus, heat is still trapped within the envelope of the IC die by the surrounding plastic mold and organic substrate.

Figure 4:
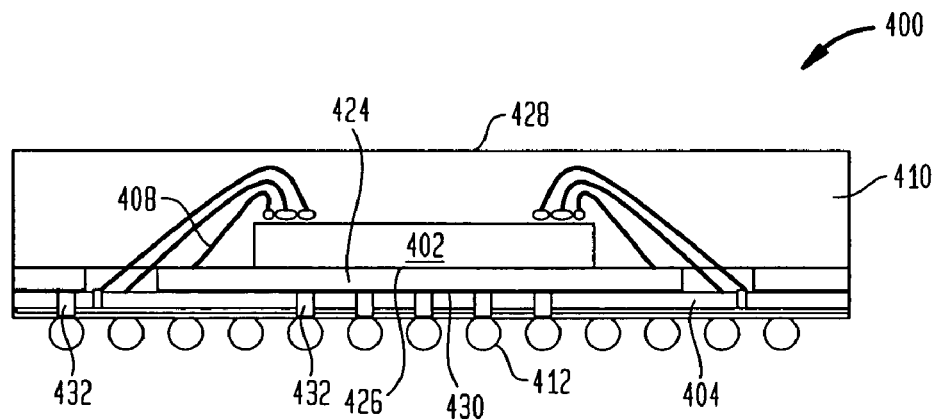
FIG. 4 shows a die-up tape BGA with a stiffener/interposer having thermal and electrical enhancements.

Ball Grid Array Package having Copper Stiffener and Thermal/Electrical Connector FIG. 4 shows a die-up tape BGA package 400 with a stiffener/interposer 424. To increase heat transfer area from an IC die 402 to the rest of package 400, copper stiffener/interposer 424 used. An example of this is found in U.S. Ser. No. 09/984,259, filed Oct. 29, 2001, which is incorporated by reference herein in its entirety.

As shown in FIG. 4, die 402 has opposing first and second surfaces 426 and 428. In package 400, first surface 426 of IC die 402 is attached to a flat copper stiffener 424. The second surface 430 of copper stiffener 424 is attached to an organic substrate 404, such as a polyimide tape or resin epoxy (e.g., BT) substrate. Copper stiffener 424 has a larger surface area than die 402 and promotes heat dissipation into the surrounding materials. Ground/thermal balls 412 under die 402 are connected to copper stiffener 424 through ground/thermal vias 432 in substrate 404. Connecting the ground/power pads of IC device 402 to metal stiffener 424 further reduces package inductance for ground current return and power delivery.

Figure 5:
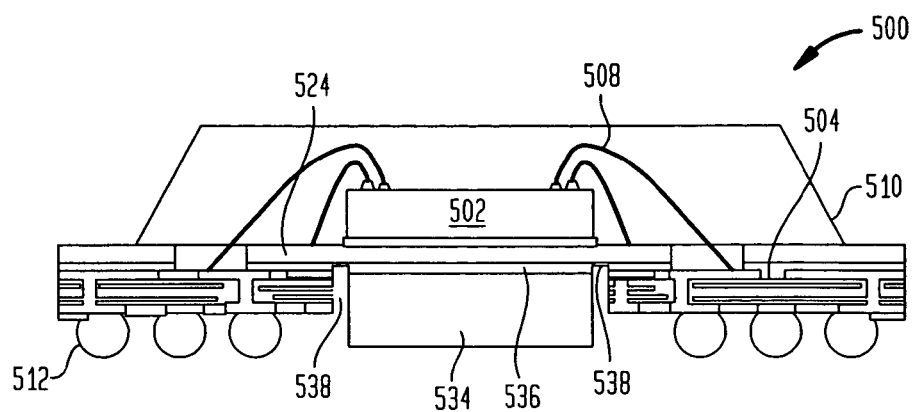
FIG. 5 shows a die-up tape BGA with a stiffener/interposer and thermal/electrical connectors.

Ball Grid Array Package with Copper Stiffener/Interposer and Thermal/Electrical Connector FIG. 5 shows a die-up tape BGA 500 with a stiffener/interposer 524 and thermal/electrical connector 534. By providing an opening 538 in a center region of substrate 504, thermal and electrical connection between die 502 and a printed circuit board (not shown) can be implemented using ground/thermal connector 534. A first surface 528 of IC die 502 is attached directly to a first surface of stiffener 524. A second surface 530 of copper stiffener 524 is attached to a thermal/electrical connector 534 that functions as a thermal/electrical connector. Thermal/electrical connector 534 bridges heat and electron flow from copper stiffener 524 to a printed circuit board on which package 500 is mounted.

Stiffener 524, on which die 504 is attached (e.g., as shown in FIG. 4 and FIG. 5), can be connected to a ground pad of IC die 502 through a wirebond 508.

The loop inductance of power delivery and current return between package 500 and PCB or printed wire board (PWB) is reduced by the use of thermal/electrical connector 534.

Exemplary Power Operation in Integrated Circuits

Operations in integrated circuits (IC) are driven by power supply. The rate of operations is limited by the number of transistors and other elements in the integrated circuit and by the power delivery speed to these elements. An increase in the operating frequencies of ASIC (application specific integrated circuit) devices for high speed broadband communication systems requires on-chip power delivery at a higher current density and shorter time during which the current is switched. This is discussed, for example, by K. T. Tang and E. G. Friedman, "Simultaneous Switching Noise in On-Chip CMOS Power Distribution Networks," *IEEE Transactions on Very Large Scale Integration (VLSI) Systems*, Vol. 10, No. 4, pp. 487-493, August 2002, which is incorporated by reference herein in its entirety.

Metal lines are used in IC and VLSI (Very Large Scale Integration) chips to distribute power. These metal lines are plagued by electromigration and excessive line resistance. Electromigration is mass transport due to momentum exchange between conducting electrons and diffusing metal atoms, which can cause progressive damage to metal conductors in an integrated circuit. This is discussed, for example, in W. S. Song and L. A. Glasser, "Power Distribution Techniques for VLSI Circuits", Vol. SC-21, No. 1, pp. 150-156, February, 1986, which is incorporated by reference herein in its entirety. Electromigration causes both open and short circuits in IC metal lines. This is discussed, for example, in Jim Lloyd and David Overhauser, "Electromigration wreaks havoc on IC design", EDN, Mar. 26, 1998, which is incorporated by reference herein in its entirety. Combined with high current for power delivery, excessive power supply line resistance causes a voltage drop along the power supply line.

The voltage drop of an on-chip power-ground network caused by both current and resistance is called "IR drop" (I represents current, R represents resistance). This is discussed, for example, in S. Lin and N. Chang, "Challenges in Power-Ground Integrity", Proceedings of the 2001 IEEE/ACM International Conference on Computer-aided design, pp. 651-654, Nov. 4-8, 2001, which is incorporated by reference herein in its entirety. IR drop occurs along interconnects/metal lines and causes decreased performance through slower switching speeds. It can typically be avoided by installing a sufficient number of power trunks and connections to limit the drop in voltage.

To alleviate the problems of high current in resistive metal lines, a multi-layer power distribution network was proposed for on-chip power distribution across a semiconductor die using uniformly placed mesh-like interwoven power and ground metal lines/trunks. Typically two or more metal layers are used to create a power-ground network. A very thick top layer metal is used to distribute power to the large sections of the chip. On the layer below, smaller lines are used to distribute power to the smaller sections of the chip. The majority of the voltage drop and the maximum current density are on the top layer for most of the practical cases. Therefore, the power limits for the voltage drop and the current density for the IR drop are controlled by the upper limits of the top layer thickness, given the particular fabrication technology.

In practice, both power and other signals have to be routed using metal lines. Thicker and more power trunks means less area remains for on-chip signal routing and may require the die size to be increased. For IC die interconnected by wire bonds, the power and I/O bond pads are typically located along the periphery of the die. Uniform placement of the power bond pads requires that more I/O signal bond pads be pushed towards the corners of the die. When I/O signals are pushed to die corners, a mismatch between a bond wire length and package trace lengths is introduced, which may cause skew on wide I/O wirebond lines. This is discussed, for example, in U.S. Pat. No. 6,657,870 B1 that issued Dec. 2, 2003, entitled "Die Power Distribution System," which is incorporated herein by reference in its entirety.

Exemplary Cavity Down Ball Grid Arrays having More Efficient Power Operation

As discussed above, what is needed is an efficient power delivery structure in an IC package that reduces the trace length on top metal of the die, reduces the wire bond length to the power/ground pads of the die, and reduces the trace length from PCB or PWB power/ground planes to the package. Thus, as discussed above, embodiments are described herein that provide an interposer substrate structure for IC packages. The interposer substrate reduces the interconnect length to power and ground pads on a top layer of a semiconductor or integrated circuit (IC) die. The interposer substrate also removes the requirement that power and ground pads be located on a periphery of the die. Power and ground pads can be located in an interior region on a top metal layer where they can be interconnected to the interposer substrate using electrically conductive bumps (e.g., solder, gold, etc.) or wire bond(s).

Exemplary BGA Package Embodiments

Figure 6A:
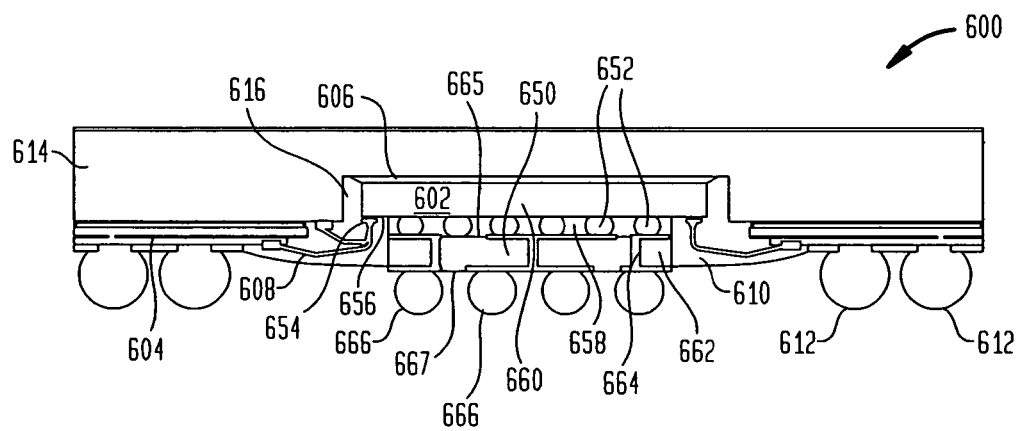
FIG. 6A shows a TBGA implementation including an interposer substrate having a solder bump interconnect with an IC die, according to an embodiment of the present invention.
Figure 6B:
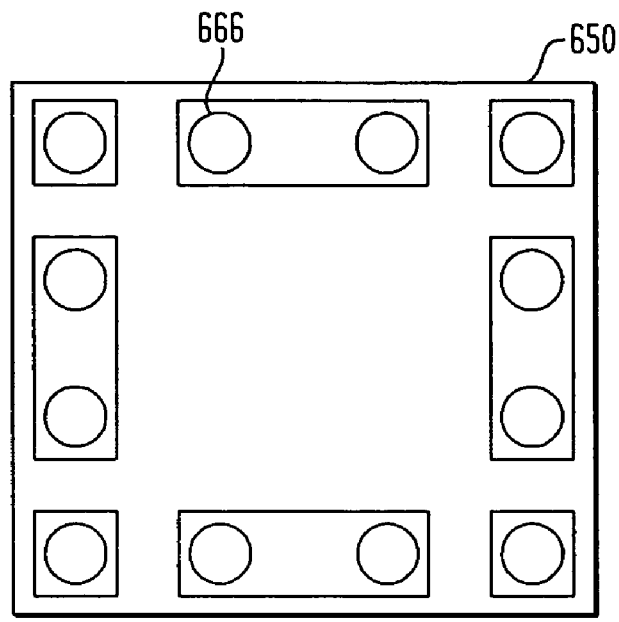
FIGS. 6B and 6C show top and bottom views, respectively, of the interposer substrate in FIG. 6A, according to an embodiment of the present invention.
Figure 6C:
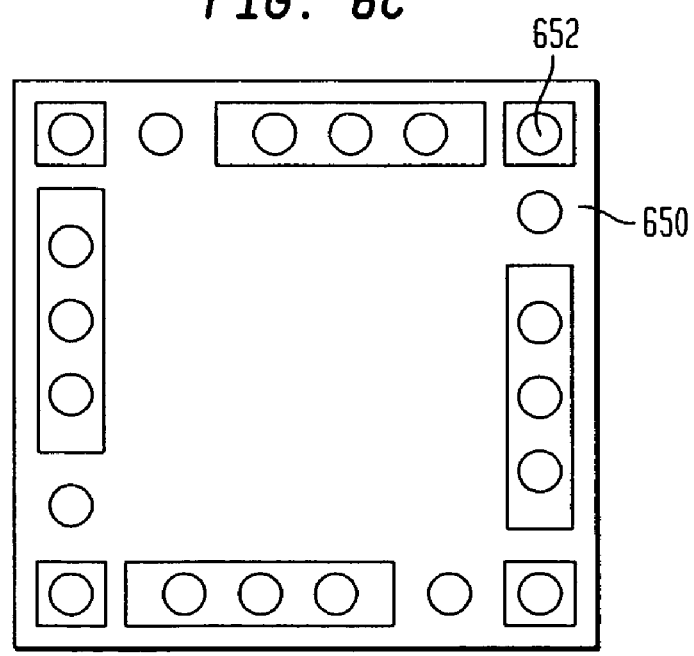

FIG. 6A shows a TBGA package 600 using second substrate 650 (e.g., an interposer substrate) having solder bump interconnect 652 with die 602, according to an embodiment of the present invention. FIGS. 6B and 6C show top and bottom views, respectively, of second substrate 650, according to an embodiment of the present invention. Semiconductor die 602 is attached to cavity 616 of heat spreader 614. Wirebond interconnect 608 (i.e., one or more wire bonds) is used to electrically connect a bond pad 654 on a periphery 656 of die 602 to substrate 604 (e.g., a tape substrate) and heat spreader 614. Interposer substrate material of second substrate 650 can be organic (e.g., BT, FR4, etc.) ceramic, glass, tape (e.g., polyimide tape), or other dielectric materials. Underfill 658 is used to secure bump interconnect 652 between bond pads (not shown) in center region 660 of die 602 and interposer substrate 650. In an example, an underfill process used to deposit underfill 658 is the same as those used in conventional flip chip technology.

In embodiments, interposer substrate 650 has one or more electrical routing layers 662, including 1, 2 or more (e.g. 3, 4, 5, ..., etc.). In an example, layers 662 are constructed through lamination, build-up, or other processes, as would be apparent to one of ordinary skill in the art.

In the example shown in FIG. 6A, first and second layers 662 shown both in FIG. 6A are provided in interposer substrate 650 with electrical routing on both top and bottom surfaces of die 602. Plated through-hole (PTH) vias 664 connect metal traces (not shown) on top surface 665 of substrate 650 to metal traces or ball pads (not shown) on bottom surface 667 of interposer substrate 650.

In various examples, bump material for interconnect 652 between interposer substrate 650 and central region 660 of die 602 can be solder, gold, electrically conductive polymer, epoxy/adhesive column, or other metallic materials. Any number of bump interconnects 652 can be used, including an array of bump interconnects 652.

In an example, interconnect bumps 652 (e.g., solder bumps) can be initially deposited on the bond pads of die 602. Interposer substrate 650 is subsequently placed on bumped die 602 with interconnect bumps 652 touching the corresponding pads on interposer substrate 650. In various examples, reflow for solder type bumps or curing for epoxy type of bumps complete the interconnection.

In an example, a bumped die 602 may also be placed on interposer substrate 650 prior to reflow or curing to complete the bump interconnection.

In an example, a bump interconnect 652 may also be deposited on interposer substrate 650 (as shown in FIG. 6C) using multiple different materials. For example, a base material of bumps 652 is copper, and bumps 652 are deposited on interposer substrate 650 shaped like columns or truncated spheres. Copper bumps 652 are subsequently covered with solder, gold, other electrically conductive materials, which could also promote attachment to bond pads 654 on die 602.

In an embodiment, one or more solder balls 666 are used to couple second substrate 650 to a PCB/PWB. In an example, as shown in FIG. 6B, an array of solder balls 666 (e.g., center solder balls) is attached to ball pads on bottom surface 667 for electrical interconnect with a printed wire board (PWB) (not shown), on which package 600 is to be surface mounted. Note that solder balls 666 and bumps 652 can be formed in a ring (as shown in FIGS. 6B and 6C), as a fully filled array, or in any other configuration on interposer substrate 650.

In an example, for power delivery and ground current return, solder balls 666 on the bottom surface 667 of interposer substrate 650, as well as the solder bumps 652 on top surface 665, can be used to transmit and receive I/O signals.

Encapsulation material 610 is used to fill cavity 616, cover wirebond interconnects 608, and die 602. In this example, the bottom surface 667 of interposer substrate 650 is not covered by encapsulant 610. In an example, the encapsulation process is the same as used for TBGA (e.g., dam-and-fill or "glob top").

In another embodiment, a ball grid array package 600 has a metal interposer substrate 650. In various examples of this embodiment, interposer substrate 650 can be made of metal or other electrically conductive materials. In an example, interposer substrate 650 is a copper or aluminum plate. Silver or solder plated pads 652 are shown on both top surface 654 for solder bumps 656 and on bottom surface 658 for solder balls 660 to facilitate the interconnections. Because interposer substrate 650 is electrically conductive in all directions, solder balls 660 and bumps 656 are only used for power delivery or ground current return (e.g., Vdd or Vss). An underfill 662 is used to secure bump interconnect 656 between bond pads (not shown) in a center region of die 602 and pads 652 on top surface 654 of interposer substrate 650. In an example, an underfill process is the same as those used in conventional flip chip technology.

Figure 7:
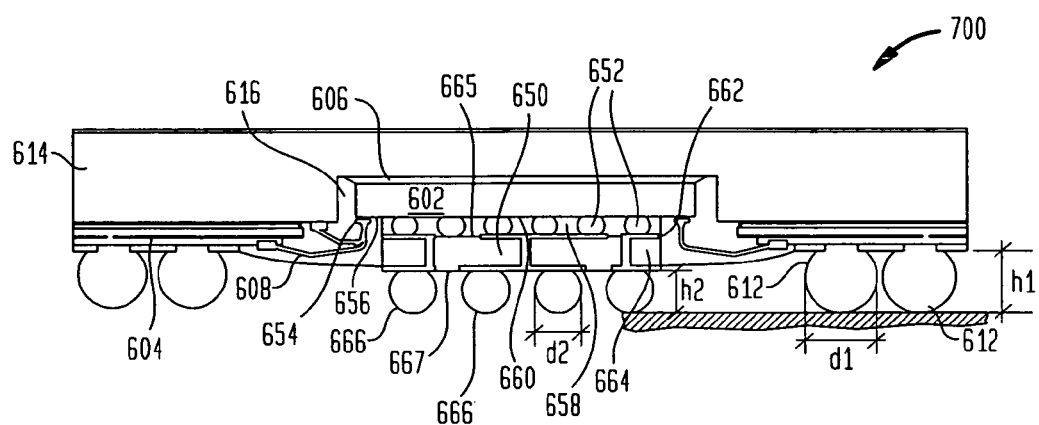
FIG. 7 shows a standoff height for a tape substrate and an interposer substrate of the TBGA implementation of FIG. 6A, according to an embodiment of the present invention.

FIG. 7 shows a standoff height, h1, for tape substrate 604, and a standoff height, h2, for interposer substrate 650, according to an embodiment of the present invention. In an example, a diameter, d2, of solder balls 666 on the bottom of interposer substrate 650 is smaller than a diameter, d1, of solder balls 612 on the bottom of tape substrate 604, if h2 is less than h1, and vice versa. Thus:

$d2 < d1$, if $h2 < h1$; and $d2 > d1$, if $h2 > h1$.

By controlling the depth of cavity 616, die 602 thickness, interposer substrate 650 thickness, bump interconnect 652 diameter, and the thickness of the die-to-heat spreader attach, the interposer substrate 650 standoff height, h2, can be larger, equal, or smaller than the standoff height, h1, of the tape substrate 604 ($h2 < h1$, $h2 = h1$, and $h2 > h1$ are all possible).

A center-to-center distance between solder balls 666 (e.g., ball pitch) on interposer substrate 650 may be the same or different from the ball pitch of peripheral ball array 612 on tape substrate 604. A full array (M×N) of solder ball matrix can be attached to interposer substrate 650 bottom surface 667. Solder balls 666 may also be depopulated in the center, or middle rows of the ball matrix.

FIGS. 8 to 12 below show additional embodiments, similar to package 600 of FIG. 6A, with references described below. Note that the embodiments herein can be combined in any manner.

EBGA Implementation

Figure 8:
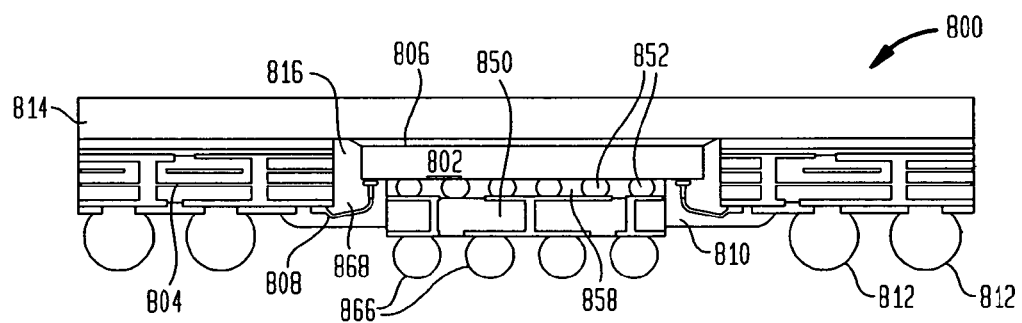
FIG. 8 shows an enhanced BGA (EBGA) package, according to an embodiment of the present invention.

FIG. 8 shows an enhanced BGA (EBGA) package, according to an embodiment of the present invention. FIG. 8 is a cavity down plastic ball grid array package 800 with a second substrate 850 (e.g., printed circuit interposer) attached to a center region of a die 802 using solder bumps 852. A planar heat spreader 814 is used, which can be a piece of metal plate, typically made of copper. An organic substrate 804 (e.g., BT or FR4) with a center opening 868 is attached to heat spreader 814. In an example, substrate 81 has four or more metal routing layers. Note that a package 800 without interposer substrate 850 is sometimes called an enhanced ball grid array package, or EBGA. The other features of the design are generally the same as the TBGA implementation described above.

Figure 9A:
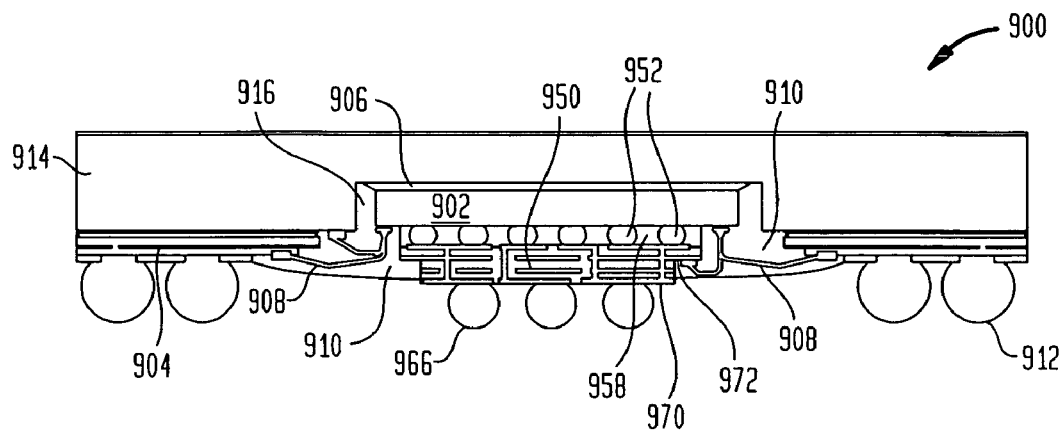
FIGS. 9A and 9B show cross-section and bottom views, respectively, of a BGA package having an interposer substrate interconnect with a die using bumps and wirebonding, according to an embodiment of the present invention.
Figure 9B:
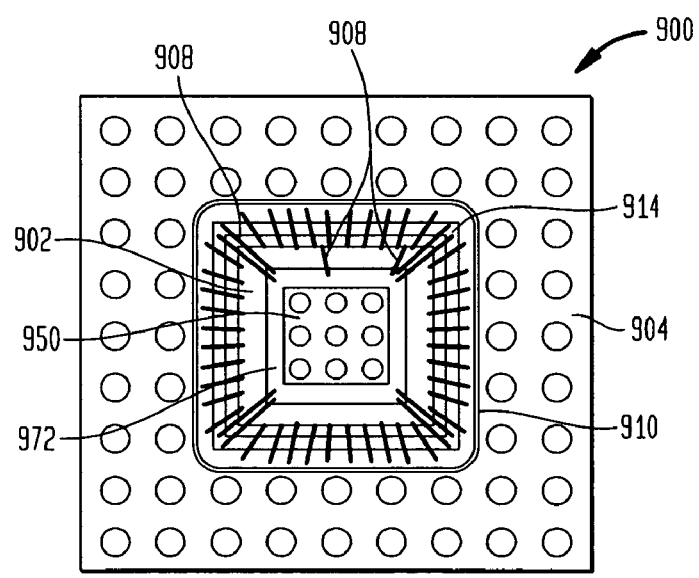

Ball Grid Array Package using Bump and Wirebond Interconnect Between an Interposer Substrate and a Die FIGS. 9A and 9B show cross-sectional and bottom views, respectively, of a ball grid array package 900 having a second substrate 950 (e.g., an interposer substrate) attached to a die 902 using bumps 952 and wirebonding 908, according to an embodiment of the present invention. An electrical interconnect between interposer substrate 950 and semiconductor die 902 can have both bump 952 (e.g., solder, gold, or other electrically conductive materials) interconnection to the center region of die 902 and wire bond 908 to the periphery of die 902. In an example, interposer substrate 950 can have multi-layer routing planes 970. For example, interposer substrate 950 can have four routing planes 970. In an example, wire bond 908 can also be used for electrical interconnect between a ledge or step 972 of interposer substrate 950 and substrate 904, to couple to any of the conductive layers of second substrate 950.

In an example, when a multi-layer substrate is used for interposer substrate 950, one or more internal planes 970 may be exposed on the exterior periphery for wire bond connection.

Figure 10:
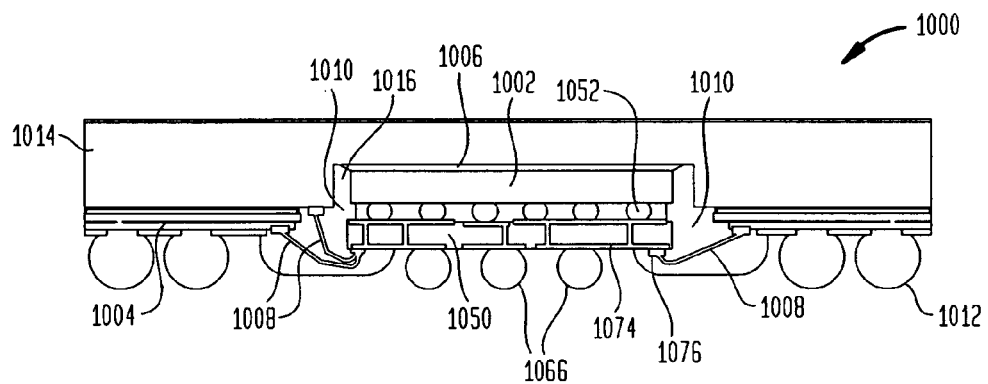
FIG. 10 shows a BGA package having wire bonds used for interposer substrate interconnection with package substrate and package heat spreader, according to an embodiment of the present invention.

FIG. 10 shows a package 1000 including wire bonds 1008 for coupling interposer substrate 1050 with a substrate 1004 and a heat spreader 1014, according to an embodiment of the present invention. In an example, a wire bond 1008 can be used to couple interposer substrate 1050 and heat spreader 1014.

Figure 11:
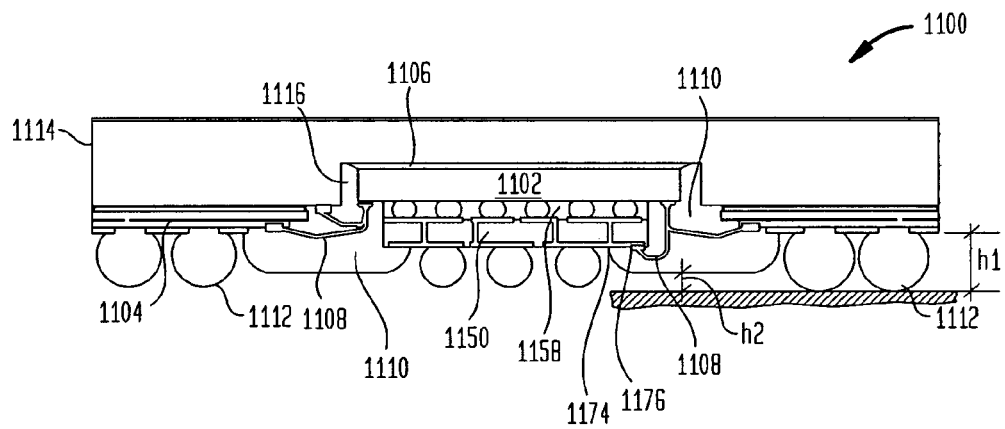
FIG. 11 shows a BGA package having a wire bond finger on an interposer substrate bottom surface, according to an embodiment of the present invention.

FIG. 11 shows a package 1100 including a wire bond finger 1176 on a bottom surface 1174 of an interposer substrate 1150, according to an embodiment of the present invention.

With reference to FIGS. 10 and 11, bond finger 1076/1176 on interposer substrate 1050/1150 can be located on bottom surface 1074/1174 of interposer substrate 1050/1150. After wire bonding, bond fingers 1076/1176 on both package substrate 1004/1104 and interposer substrate 1050/1150 are covered by encapsulation material 1010/1110 such as in a "glob top" fashion. In these examples, the glob top coverage on bottom surface 1074/1174 of interposer substrate 1050/1150 is around the external periphery, while the center region is exposed (i.e., not covered by encapsulation material 1010/1110). The glob top coverage on a bottom surface of package substrate 1004/1104 is around the interior region near die 1002/1102, while and the external region (near outer edges of substrate 1004/1104) is exposed. In an example, a thickness of the encapsulation 1010/1110 must be controlled, such that the encapsulation standoff height, h2, is large enough to allow the collapse of solder balls 1012/1112 and 1066/1166 of package substrate 1004/1104 and interposer substrate 1050/1150 during surface mount to a PCB/PWB.

Figure 12:
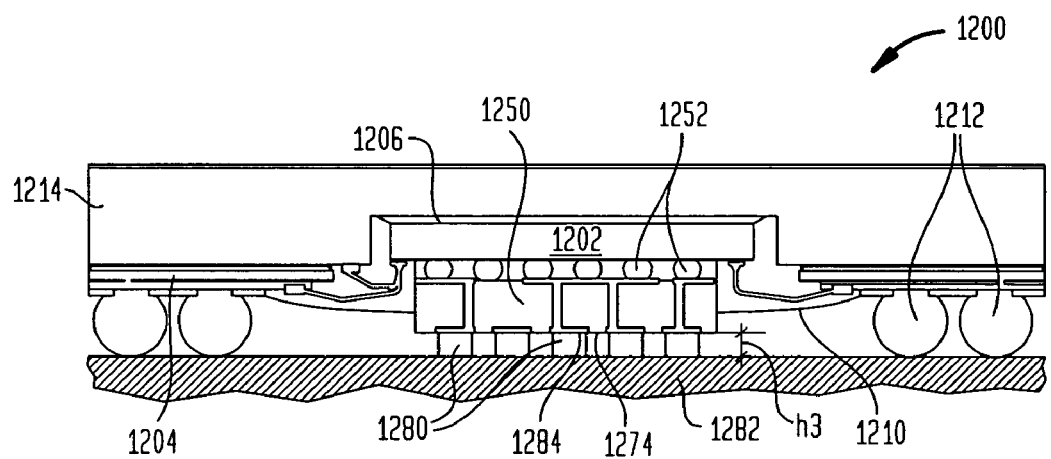
FIG. 12 shows a BGA package having an interposer substrate having a land grid array (LGA) for interconnect and surface mount on a printed wire board (PWB), according to an embodiment of the present invention.

Package having an Interposer Substrate using Land Grid Array (LGA) for Interconnect and Surface Mount on PWB FIG. 12 shows package 1200 including an interposer substrate 1250 having a land grid array (LGA) 1280 for interconnect and surface mount on a printed wire board (PWB) 1282, according to an embodiment of the present invention. Thus, alternative to the ball grid array type interconnections shown in FIGS. 6-11, an array of exposed conductive pads 1284 on a bottom surface 1274 of second substrate 1250, without attachment of solder balls, can be used for electrical interconnect with PWB 1282, on which package 1200 is to be surface mounted. In this example, a standoff height, h3, of interposer substrate 1250 is small enough so that when package 1200 is placed on a PWB 1282, exposed conductive pads 1284 on a bottom surface 1274 of interposer substrate 1250 are in touch with an array of solder paste 1280 (e.g., pre-printed solder paste columns) on PWB 1282 at the corresponding locations. In an example, after a reflow process, solder paste columns 1280, together with peripheral solder balls 1212, collapse and solidify and connect interposer substrate 1250 with PWB 1282.

In an example, copper pads are used for exposed conductive pad array 1284. The exposed pad array interconnection is also called a land grid array (LGA). The exposed conductive pads 1284 may have surface coating, such as being plated with solder, silver or other conductive material to assist wetting of solder during a surface mount process.

In an example, an array of pins (not shown) can also be attached to interposer substrate 1250 for the interconnection with PWB 1282.

Ball Grid Array Package Including a Metal Interposer Substrate

Figure 13:
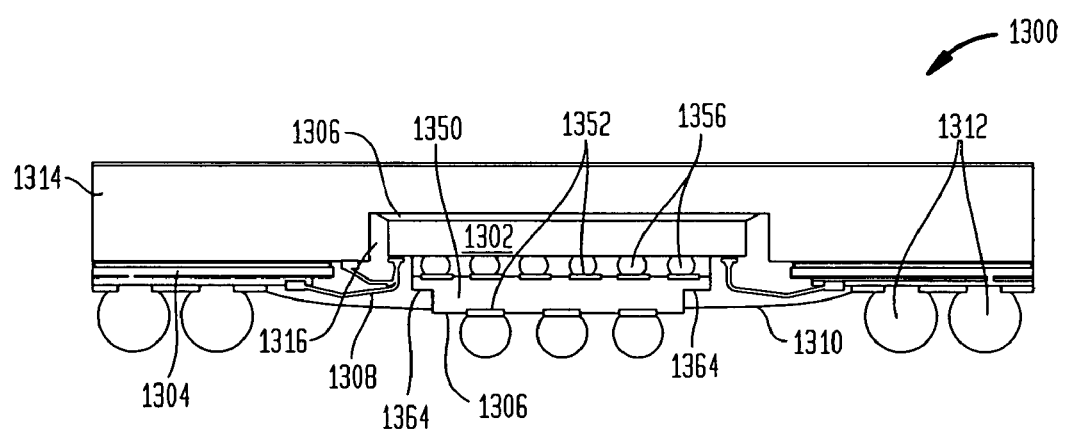
FIGS. 13 and 14 show ball grid array packages including a metal interposer substrate having a step along its periphery, according to various embodiments of the present invention.

FIG. 13 shows a ball grid array package 1300 including a metal interposer substrate 1350 having a step 1364 along its periphery, according to various embodiments of the present invention. In FIG. 13, to improve mold locking of interposer substrate 1350, one or more ledges or steps 1364 along a periphery of metal interposer substrate 1350 can be made by etching, stamping, or other metal forming methods. An encapsulation material 1310 covers step 1364 to provide secure locking of interposer substrate 1350. In various examples, a sidewall 1366 of step 1364 can be completely covered by encapsulation material 1310 or be partially exposed.

Figure 14:
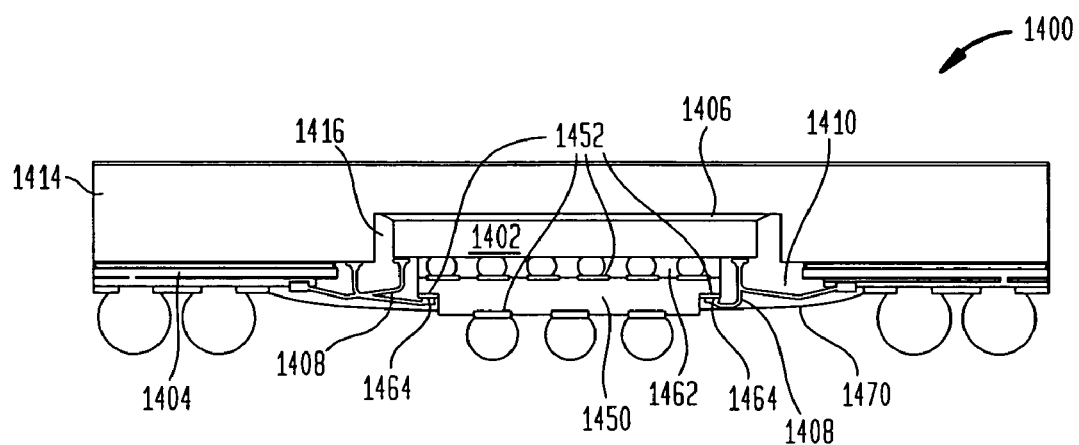

FIG. 14 shows a ball grid array packages 1400 including a metal interposer substrate 1450 having a step 1464 along its periphery, according to various embodiments of the present invention. In FIG. 14, power or ground pads 1468 along a periphery of semiconductor die 1402 can be connected to metal interposer substrate 1450 using one or more wire bonds 1408.

In an example, to facilitate the wire bond connection, a wire-bonding surface 1470 on step 1464 of metal interposer substrate 1450 can be selectively deposited with a layer of silver, gold, or other electrically conductive materials by plating or other surface coating methods. For example, a plating material 1452 can be deposited on surface 1470.

In an example, a heat spreader 1414 can be connected to metal interposer substrate 1450 using one or more wire bonds.

Figure 15:
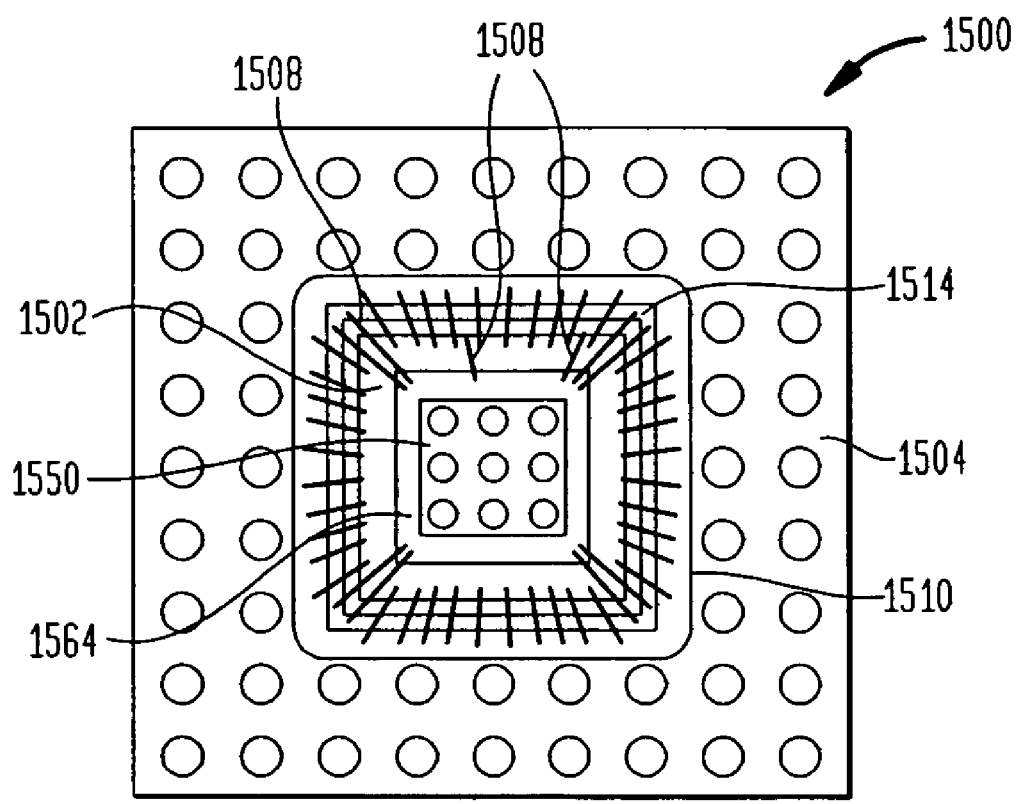
FIG. 15 shows a bottom view of a ball grid array package including a metal interposer substrate, according to an embodiment of the present invention.

FIG. 15 shows a bottom view of a ball grid array package 1500 including a metal interposer substrate 1550, according to an embodiment of the present invention. In FIG. 15, to avoid short circuits, a wire connection 1508 between interposer substrate 1550 and a heat spreader 1514 is at corners of the devices. In this example, an encapsulation 1510 is shown as being transparent in order to illustrate the package structure underneath encapsulation 1510. Wire bond connections 1508 from interposer substrate 1550 to a die 1502 and to heat spreader 1514 are also shown.

In an example, when heat spreader 1514 and metal interposer substrate 1550 are interconnected, the two pieces are at a same electrical potential. A cavity (not shown) in heat spreader 914 becomes a Faraday cage housing semiconductor die 1502. It is to be appreciated that such a package structure provides excellent shielding of electromagnetic interferences (EMI) radiated from die 1502 inside package 1500 or towards die 1502 from outside of package 1500.

Ball Grid Array having a Metal Interposer Substrate having Surface Mount (SMT) Pads for Interconnect and Surface Mount on a Printed Wire Board (PWB)

Figure 16A:
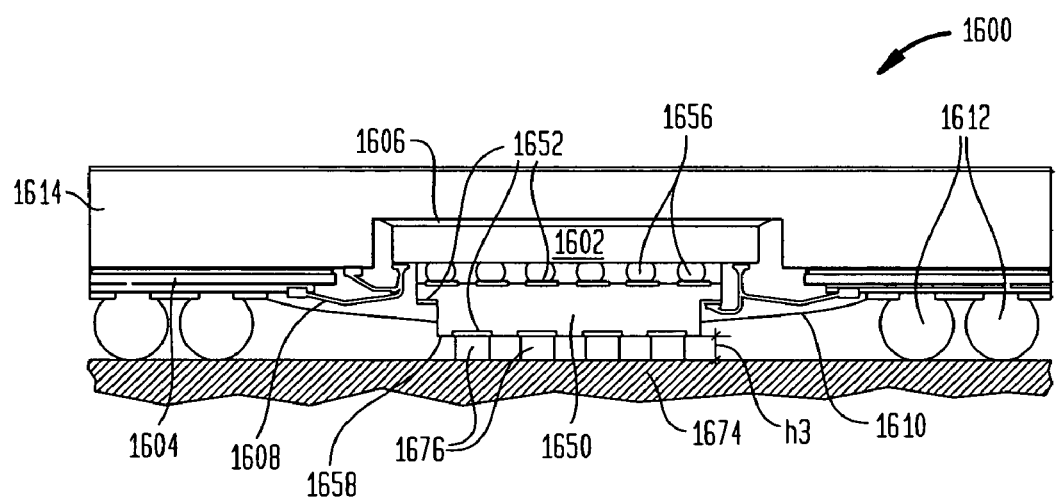
FIGS. 16A and 16B show cross-sectional and bottom views, respectively, of a ball grid array package including a metal interposer substrate having surface mount (SMT) pads for interconnect and surface mount on a printed wire board (PWB), according to an embodiment of the present invention.
Figure 16B:
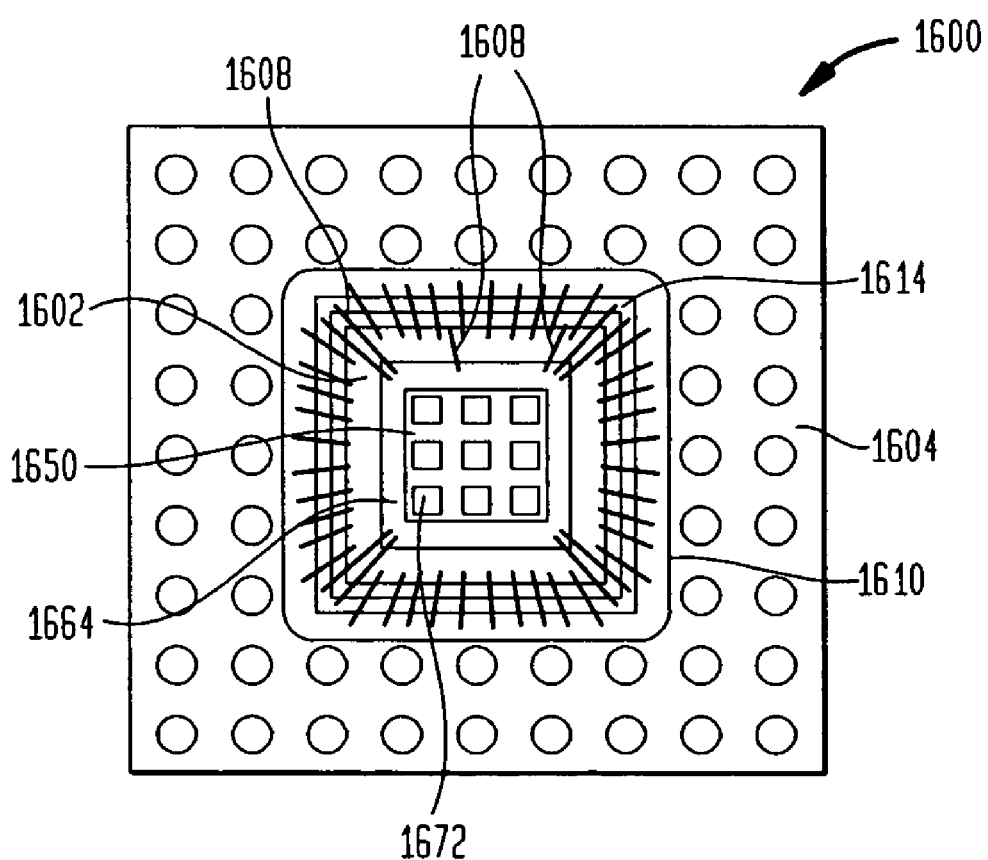

FIGS. 16A and 16B show cross-sectional and bottom views, respectively, of a ball grid array package 1600 including a metal interposer substrate 1650 having surface mount (SMT) pads 1672 (FIG. 16B) for interconnect and surface mount on a printed wire board (PWB) 1674, according to an embodiment of the present invention. A matrix of surface mount (SMT) pads 1672 can be patterned on a bottom surface 1658 of metal interposer substrate 1650 for interconnection with PWB 1674. This is similar to using a land grid array (LGA) for the interconnect between an interposer substrate and a PWB, as discussed above. In various examples, bottom surface 1658 is finished by selective metal deposition of solder, silver, gold, or other metals to promote soldering to the corresponding land pad 1676 (e.g., printed solder paste) on PWB 1674 during a surface mount process. Parameters, such as standoff height, h3, as discussed above, are used when determining how to configure metal interposer substrate 1650 for a particular application.

Metal Interposer Substrate on a Dielectric Material

Figure 17:
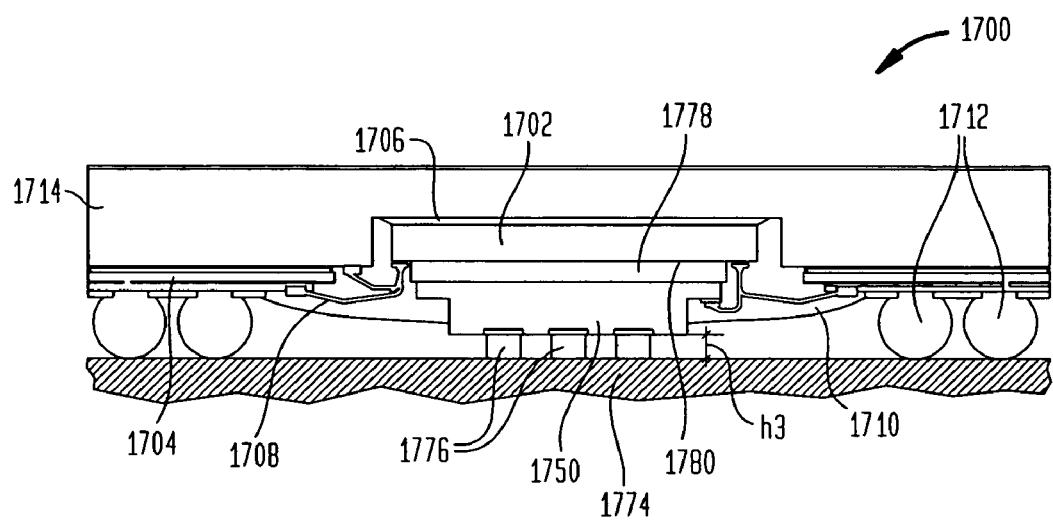
FIG. 17 shows a ball grid array package having a metal interposer substrate on a dielectric material, according to an embodiment of the present invention.

FIG. 17 shows a ball grid array package 1700 having a metal interposer substrate 1750 on a dielectric material 1778, according to an embodiment of the present invention. Solder or other conductive bumps are not required for the electrical interconnect between metal interposer substrate 1750 and a semiconductor die 1702. In this example, wire bond 1708 is used to connect interposer substrate 1750 with power or ground pads 1768 on the periphery of die 1702. An example of a similar structure can be found in FIG. 3 of U.S. Ser. No. 09/783,034, filed Feb. 15, 2001, entitled "Enhanced Die-Down Ball Grid Array Packages and Method for Making the Same," which is incorporated by reference herein in its entirety. However, in FIG. 17 dielectric material 1778 is located between metal interposer 1750 substrate and top surface 1780 of die 1702. In an example, dielectric material 1778 prevents direct contact of electrically conductive interposer substrate 1750 with a circuit (not shown) on die surface 1780, which could cause shorting of the circuit. In various examples, dielectric material 1778 can be a tape, BT, FR4, ceramic, thermal interface material (TMI), adhesive, or other similar materials, as would be apparent to one of ordinary skill in the art.

Figure 18:
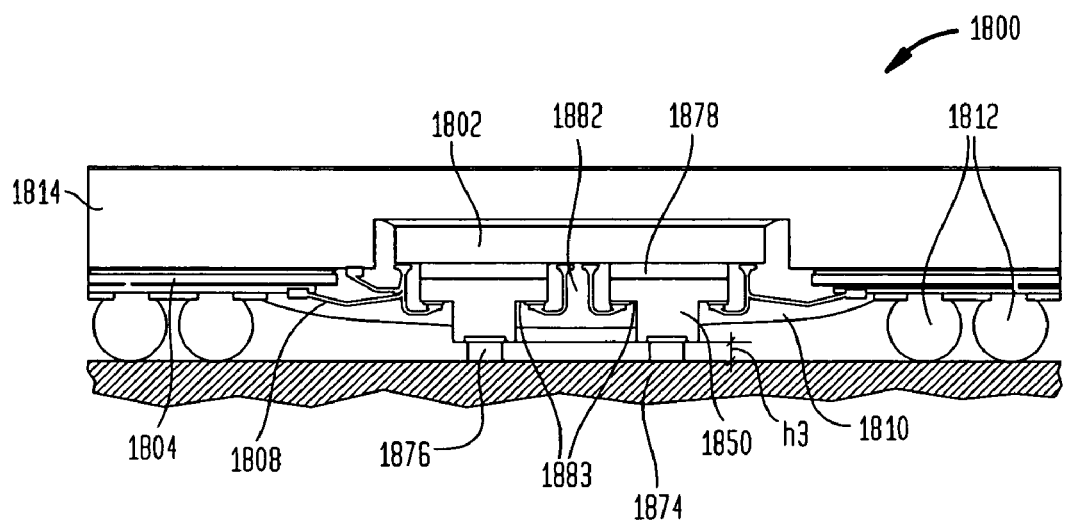
FIG. 18 shows a ball grid array package having a conductive interposer substrate with a center opening for wire bond interconnection, according to an embodiment of the present invention.

Ball Grid Array Package having a Conductive Interposer Substrate with a Center Opening for Wire Bond Interconnection FIG. 18 shows a ball grid array package 1800 having a conductive interposer substrate 1850 with a center opening 1882 for wire bond interconnection, according to an embodiment of the present invention. This configuration can be used to attach metal interposer substrate 1850 to power or ground pads (not shown) in a center region of a die 1802 using one or more wire bonds. As shown in FIG. 18, substrate 1850 ha a central ledge or step 1883 surrounding opening 1882, for convenience in wire bond attachment, for wire bonds extending through opening 1882. Step 1883 can extend partially or entirely around opening 1882.

Figure 19A:
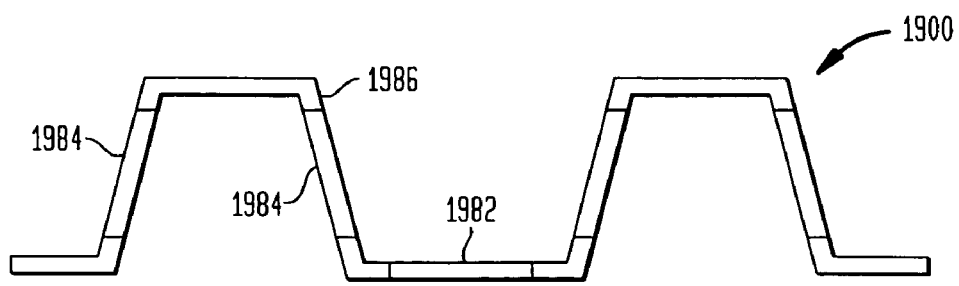
FIGS. 19A and 19B show cross sectional and top views, respectively, of a structure of a conductive interposer substrate with opening in a center thereof, according to an embodiment of the present invention.
Figure 19B:
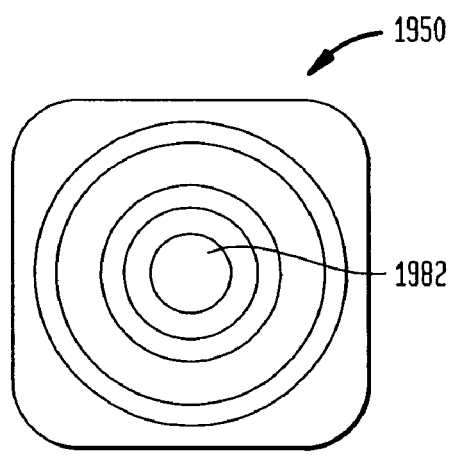

FIGS. 19A and 19B show cross sectional and top views, respectively, of a structure of a conductive interposer substrate 1950 with an central opening 1982, according to an embodiment of the present invention. In an example, an opening 1982 is used for wire bond interconnect. In an example, as shown in FIG. 19A, mold gate openings 1984 on sidewalls 1986 of interposer substrate 1950 are used for mold flow during an encapsulation process.

For example, interposer substrate 1950 with openings 1984 can be used in place of interposer substrate 1850 in cavity down package 1800 shown in FIG. 18, and discussed above. In an example where package 1800 uses dam-and-fill (e.g., glob top) process for die encapsulation, interposer substrate 1950 is attached to the center region of a die 1802 after die 1802 is attached to heat spreader 1814. After a wire bonding process is performed, a plastic dam (not labeled in FIG. 18) is deposited over substrate 1804 surrounding a periphery of bond fingers (e.g., location of wire bond) on substrate 1804. A mold compound is subsequently filled in between the dam and a top pedestal of metal interposer substrate 1950. Mold gate openings 1984 allow the molding compound to flow under metal interposer substrate 1950 and cover die 1802, possibly for environment protection.

Figure 20A:
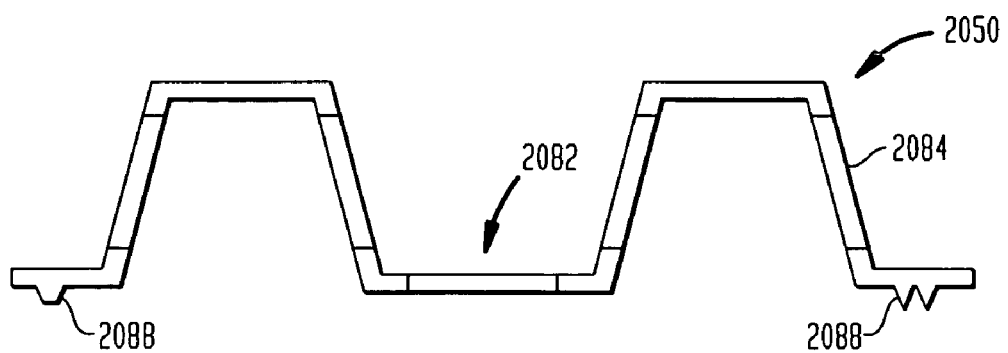
FIGS. 20A and 20B show cross sectional and top views, respectively, of a structure of a conductive interposer substrate with an opening in a center and a mold locking mechanism, according to an embodiment of the present invention.
Figure 20B:
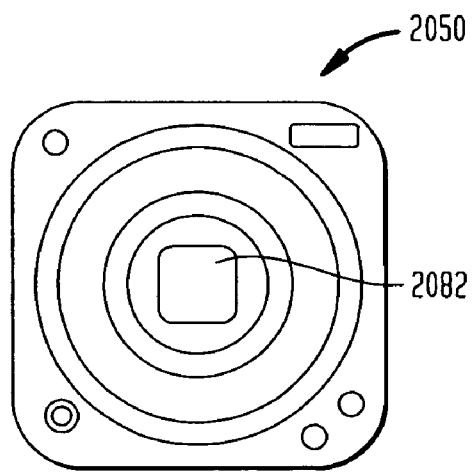

FIGS. 20A and 20B show cross sectional and top views, respectively, of a structure of a conductive interposer substrate 2050 with an opening 2082 in a center and one or more mold locking mechanisms 2088, according to an embodiment of the present invention. To secure interposer substrate 2050, mold locking tabs or notches 2088 can be patterned on metal interposer substrate 2050. For example, shapes of tabs or notches 2088 can be, but are not limited to, trapezoidal and triangular.

In various examples, a shape of center opening 1802, 1902, and/or 2002 for wire bond can be circular (see FIG. 19B), square (see FIG. 20B), and other regular or irregular shapes.

Additional Features and Examples

Example additional features and advantages are described in this section.

An interposer substrate (e.g. 650 of FIGS. 6A-6C and 7, 850 of FIG. 8, 950 of FIG. 9, 1050 of FIG. 10, 1150 or FIG. 11, 1250 of FIG. 12, 1350 of FIG. 13, 1450 of FIG. 14, 1550 of FIG. 15, 1650 of FIGS. 16A-16b, 1750 of FIG. 17, and/or 1850 of FIG. 18) is attached to a central region of a semiconductor die, enabling interconnect to the semiconductor die in its central region without increasing the interconnect resistance and inductance.

The interposer substrate can be used for power distribution and power delivery, as well as I/O signal routing.

Both electrically conductive bumps and wire bonds can be used for interconnect between the interposer substrate and the die.

The interposer substrate can have multiple types of interconnect (e.g., solder balls, wire bonds) to different bond pads on the same die. The interposer substrate can be electrically connected to a PCB or printed wire board (PWB) by ball grid array, pin grid array, a single pad or an array of conductive pads. A circuit length from bond pads on the package die to the PWB is reduced due to the reduced distance in routing.

A center-to-center distance between the solder balls (also called ball pitch) on the interposer substrate may be the same or different from the ball pitch of the peripheral ball array on the package substrate.

A full array (M×N) of solder ball matrix can be attached to the interposer substrate bottom surface. Solder balls may also be depopulated (e.g., removed) in the center, or middle rows of the ball matrix, as desired.

A center opening on the interposer substrate that enables wire bond interconnection to the central region bond pads of the package die may be present.

Use of a lock-in mechanism design on the interposer substrate can enhance the structural integrity of cavity down package having the interposer substrate attached to the die.

The interposer substrate can be selected from a variety of substrate types (e.g., organic, tape, and ceramic, high density substrate, build-up substrate, Teflon substrate, etc.). A single routing layer substrate or multi-layer substrate can be used for the interposer substrate. An electrically conductive material, such as copper, or aluminum can be used for the interposer substrate.

"Glob top" (dam-and-fill), injection molding and other die encapsulation processes can be used.

A cavity down package heat spreader, when present, can be connected to the same electrical potential of an interposer substrate made of electrically conductive material or to a single or multi-layer interposer substrate power/ground plane to form an electromagnetic interference (EMI) shielding enclosure—e.g., a Faraday cage that houses the semiconductor die.

A metal interposer substrate surface finish can be used/applied using a variety of processes, materials, and methodologies at various surfaces, spots, and locations.

The interposer substrate can be coupled to the package substrate and to the package heat spreader using one or more wire bonds.

Different forms (e.g., steps, openings, etc.) or shapes (e.g., square, rectangular, circular, spoke-like, cutouts or notches and steps on one or more edges, etc.) can be used for the interposer substrate that reduce wire bond length and/or reduce risk of wire short circuits during package assembly processes, and to enhance package mechanical, thermal, electrical, and/or reliability performance.

In a conventional cavity down array package, the bottom center of the package is die encapsulation that does not have contact with PWB on which the package is to be mounted (e.g., the embodiment shown in FIG. 2). An air gap between the bottom surface of the encapsulation and the PWB (not shown) prevents conductive heat flow from the die to the PWB due to low thermal conductivity of the air (k=0.026 W/m·° C. for air and k~0.7 W/m·° C. for the encapsulation mold).

However, through use of the interposer substrate disclosed herein, a heat conduction path is provided for current and heat flow between the IC die and the application board (e.g. PCB or PWB). Package thermal performance is substantially improved by the interposer substrate, especially when a metal (such as copper) is used, due to the reduction of junction-to-board thermal resistance.

An electromagnetic interference (EMI) shielding enclosure (e.g., Faraday cage) can be easily constructed to house the semiconductor die by grounding the metal plane of the interposer substrate with the heat spreader of cavity down array package.

The IC die is mounted inside the heat spreader and the interposer substrate ground planes which form an electrical potential surface, such as ground potential, that substantially encloses the IC die.

This structure reduces a package EMI radiation leak to the outside of the package as well as prevents ambient EMI radiation energy from entering the cavity.

Various materials can be used for the interposer substrate to meet requirements of different applications for power delivery, signal routing, and power dissipation.

Various processes for die encapsulation can be used, including dam-and-fill ("glob top"), injection molding and others, to meet requirement of various applications and provide a package with various forms and appearances.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A ball grid array (BGA) package, comprising:
   a heat spreader;
   a first substrate having:
      an opening that extends through the first substrate, wherein said first substrate is attached to said heat spreader such that a portion of the heat spreader is accessible through the opening;
   an integrated circuit (IC) die attached to the heat spreader and located in the opening of the first substrate; and
   a second substrate having a first surface and a second surface, wherein the first surface has a bump interconnect formed thereon that is coupled to the IC die,
   wherein the heat spreader comprises a cavity in which the IC die is attached, wherein the cavity has an opening that is smaller than the opening in the first substrate, and
   wherein the second surface of the second substrate has an array of contact pads capable of coupling to a board when the BGA package is mounted to the board.

2. The BGA package of claim 1, wherein the heat spreader is a metal plate.

3. The BGA package of claim 1, wherein the heat spreader is a conductive material.

4. The BGA package of claim 1, wherein the IC die is attached to the heat spreader using an adhesive material or an epoxy.

5. The BGA package of claim 1, wherein the first substrate comprises one of a tape substrate, an organic substrate, a ceramic substrate, a glass substrate, or a polyimide tape substrate.

6. The BGA package of claim 1, wherein the first substrate is a multi-layer substrate.

7. The BGA package of claim 1, further comprising:
   an array of contact pads attached to a surface of the first substrate for mounting the package to the board.

8. The BGA package of claim 7, further comprising:
   an array of solder balls coupled to said array of contact pads to couple the package to the board.

9. The BGA package of claim 1, wherein the second substrate comprises:
   a printed circuit on one of a stiff or flexible dielectric substrate.

10. The BGA package of claim 1, wherein the second substrate is a dielectric substrate that comprises one of a bismaleimide triazine (BT) resin substrate, a resin substrate, a polyimide tape substrate, a tape substrate, a flame retardant type 4 (FR4) laminate substrate, a ceramic substrate, or a glass substrate.

11. The BGA package of claim 1, wherein the second substrate is a multi-layer substrate.

12. The BGA package of claim 1, further comprising:
an underfill material that is used to secure the interconnect bump between the bond pad and the second substrate.

13. The BGA package of claim 1, further comprising:
an encapsulating material covering at least partially the heat spreader, the first and second substrates, and the IC die.

14. The BGA package of claim 1, wherein the second substrate is attached to the central portion of the IC die, such that power is delivered to and from the central portion of the IC die via the second substrate.

15. The BGA package of claim 1, wherein the second substrate is attached to the IC die, such that power is transmitted to devices in the central portion of the IC die via the interconnect bump.

16. The BGA package of claim 1, further comprising:
an interconnect located in a peripheral area of the IC die.

17. The BGA package of claim 1, further comprising:
a wire bond arrangement that attaches at least one of the IC die, the first substrate, the second substrate, and the heat spreader to at least another one of the IC die, the first substrate, the second substrate, and the heat spreader.

18. The BGA package of claim 17, wherein the wire bond arrangement comprises:
a wire bond attaching the IC die to the heat spreader; and
at least one wire bond attaching the IC die to the first substrate.

19. The BGA package of claim 1, wherein said first substrate further comprises a conductive pad coupled to said IC die.

20. The BGA package of claim 1, wherein said second substrate is sized to permit wirebonding between said IC die and said first substrate.

* * * * *